United States Patent
Chan et al.

(10) Patent No.: US 10,396,658 B2
(45) Date of Patent: Aug. 27, 2019

(54) POWER SUPPLY PROTECTION CIRCUIT AND METHOD

(71) Applicant: JOULWATT TECHNOLOGY (HANGZHOU) CO., LTD., Hangzhou (CN)

(72) Inventors: Siopang Chan, Hangzhou (CN); Pitleong Wong, Hangzhou (CN); Xunwei Zhou, Hangzhou (CN); Yuancheng Ren, Hangzhou (CN)

(73) Assignee: JOULWATT TECHNOLOGY (HANGZHOU) CO., LTD., Hangzhou (CN)

( * ) Notice: Subject to any disclaimer, the term of this patent is extended or adjusted under 35 U.S.C. 154(b) by 239 days.

(21) Appl. No.: 15/406,668

(22) Filed: Jan. 14, 2017

(65) Prior Publication Data

US 2017/0222550 A1    Aug. 3, 2017

(30) Foreign Application Priority Data

Jan. 28, 2016  (CN) .......................... 2016 1 0058972

(51) Int. Cl.
| | | |
|---|---|---|
| *H02M 3/156* | (2006.01) | |
| *H02M 1/32* | (2007.01) | |
| *G05F 1/56* | (2006.01) | |
| *H02H 9/04* | (2006.01) | |
| *H02H 3/08* | (2006.01) | |
| *H02H 9/02* | (2006.01) | |
| *H03K 17/082* | (2006.01) | |

(52) U.S. Cl.
CPC .............. *H02M 3/156* (2013.01); *G05F 1/56* (2013.01); *H02M 1/32* (2013.01); *H02H 3/08* (2013.01); *H02H 9/02* (2013.01); *H02H 9/025* (2013.01); *H02H 9/041* (2013.01); *H03K 17/0822* (2013.01)

(58) Field of Classification Search
USPC .................................. 361/86–87, 93.7–93.9
See application file for complete search history.

(56) References Cited

U.S. PATENT DOCUMENTS

| | | | |
|---|---|---|---|
| 2012/0013367 A1* | 1/2012 | Chen .................... | H02H 7/1213 327/87 |
| 2014/0152180 A1* | 6/2014 | Wolf .................. | H05B 33/0884 315/122 |
| 2014/0168567 A1* | 6/2014 | Kikuchi ............. | H05B 33/0815 349/61 |
| 2015/0062768 A1* | 3/2015 | Prescott ................ | H02H 9/045 361/86 |

\* cited by examiner

*Primary Examiner* — Danny Nguyen

(74) *Attorney, Agent, or Firm* — Muncy, Geissler, Olds & Lowe, P.C.

(57) ABSTRACT

A power supply protection circuit and a method is described herein. The power supply protection circuit comprises a current control unit, a voltage feedback unit, and a current pull-up unit. The voltage feedback unit is connected to the current control unit, the voltage feedback unit obtains a feedback voltage of an output voltage and feeds back the feedback voltage to the current control unit, and the current control unit uses the feedback voltage to control the current control unit to regulate an output current. The current pull-up unit is connected to a feedback terminal of the voltage feedback unit, and the current pull-up unit provides the voltage feedback unit with a pull-up current to determine whether the feedback terminal of the voltage feedback unit is short-circuited.

2 Claims, 7 Drawing Sheets

POWER SUPPLY PROTECTION CIRCUIT AND METHOD

CROSS-REFERENCE TO RELATED APPLICATIONS

This Non-provisional application claims priority under 35 U.S.C. § 119(a) on Patent Application No(s). 201610058972.5 filed in People's Republic of China on Jan. 28, 2016, the entire contents of which are hereby incorporated by reference.

BACKGROUND OF THE INVENTION

Field of the Invention

The present invention relates to a power supply circuit and, more particularly, to a power supply protection circuit and a method.

Description of the Related Art

In a constant voltage output power supply circuit, an output feedback terminal FB samples output voltages by voltage-dividing resistors R1 and R2. An output current is regulated to make the voltage of the output feedback terminal FB be equal to a reference voltage in a current control unit, so as to regulate the output voltage to make it be stabilized at a preset voltage.

As shown in FIG. 1, the constant voltage output power supply circuit 100 includes a current control unit 11 and a voltage feedback unit 12. The voltage feedback unit 12 consists of a first resistor R1 and a second resistor R2 connected in series. A common point of the first resistor R1 and the second resistor R2 is a feedback terminal FB of an output voltage $V_{out}$, and the feedback terminal FB of the output voltage $V_{out}$ is connected to the current control unit 11. The current control unit 11 includes a second operational amplifier U2, a first input terminal of the second operational amplifier U2 is connected to the feedback terminal FB, and a second input terminal is connected to a second reference signal $V_{ref2}$. The second reference signal $V_{ref2}$ is compared with a feedback voltage $V_{FB}$, and the circuit is controlled according to the comparison result thus to realize the constant voltage output.

However, when an output load is short-circuited, the output feedback voltage $V_{FB}$ is about 0V. Since the current control unit 11 takes samples and detects that the output feedback voltage $V_{FB}$ is lower than the second reference signal $V_{ref2}$, the output current increases to reach the maximum output current of the constant voltage output power supply circuit 100. Since the output voltage is near 0 when the load is short-circuited, although the output current reaches the maximum output current, output power of the circuit may still be within the normal work range, and the constant voltage output power supply circuit will not be damaged due to overlarge power consumption.

BRIEF SUMMARY OF THE INVENTION

One objective of the present invention is to provide a power supply protection circuit and a method, solving the problem that when a voltage feedback unit of a constant voltage output power supply circuit is short-circuited, the circuit will be damaged.

In order to realize the above objective, the present invention provides a power supply protection circuit, comprising a current control unit, a voltage feedback unit, and a current pull-up unit;

wherein, the voltage feedback unit is connected to the current control unit, the voltage feedback unit obtains a feedback voltage of an output voltage and feeds back the feedback voltage to the current control unit, and the current control unit uses the feedback voltage to control the current control unit to regulate an output current; and the current pull-up unit is connected to a feedback terminal of the voltage feedback unit, and the current pull-up unit provides the voltage feedback unit with a pull-up current to determine whether the feedback terminal of the voltage feedback unit is short-circuited.

Optionally, the power supply protection may further comprise a regulating unit, an input terminal of the regulating unit may be connected to the feedback terminal of the voltage feedback unit, and the regulating unit may regulate the pull-up current of the current pull-up unit according to the feedback voltage, so as to determine whether the feedback terminal of the voltage feedback unit is short-circuited.

Optionally, the regulating unit may comprise a first operational amplifier, a first input terminal of the first operational amplifier may receive a first reference signal, a second input terminal may be connected to the feedback voltage, and an output terminal of the first operational amplifier may be connected to the current pull-up unit.

Optionally, a first input terminal of the current control unit may be connected to a second reference signal, and a voltage of the first reference signal may be smaller than a voltage of the second reference signal.

Optionally, the current pull-up unit may consist of a negative channel metal oxide semiconductor (NMOS) transistor and a power supply connected in series; a gate electrode of the NMOS transistor may be connected to the output terminal of the first operation amplifier, a source electrode may be connected to the feedback voltage, and a drain electrode may be connected to an output terminal of the power supply.

Optionally, the current pull-up unit may comprise a power supply and a switch transistor connected in series.

Optionally, the current pull-up unit may further comprise a current-limiting resistor connected to the switch transistor in series, or the power supply may be a constant current source.

Optionally, a fourth resistor may be connected between the feedback terminal of the voltage feedback unit and the current pull-up unit.

The present invention further provides a power supply protection method, comprising:

the current pull-up unit operates to provide the voltage feedback unit with pull-up current; and detecting a voltage of the feedback terminal of the voltage feedback unit, and determining that the feedback terminal of the voltage feedback unit is short-circuited if the voltage is lower than a standard threshold.

Optionally, when the feedback terminal of the voltage feedback unit is short-circuited, the current control unit may stop outputting a current to a load.

The present invention further provides another power supply protection method, comprising:

comparing the feedback voltage with the first reference signal;

if the feedback voltage is greater than the first reference signal, the regulating unit outputting a voltage lower than a lowest driving voltage of the current pull-up unit, and the current pull-up unit being disabled to provide the pull-up current;

if the feedback voltage is smaller than the first reference signal, the regulating unit outputting a voltage higher than the lowest driving voltage of the current pull-up unit, and the current pull-up unit providing the voltage feedback unit with the pull-up current according to the output voltage of the regulating unit;

determining a type of a short circuit according to a value of the output voltage of the regulating unit or the pull-up current; and if the output voltage of the regulating unit reaches a maximum driving voltage or the pull-up current reaches a maximum pull-up current, the feedback terminal of the voltage feedback unit being short-circuited; otherwise, the load being short-circuited.

Optionally, when the feedback terminal of the voltage feedback unit is short-circuited, perform a protection action of stopping outputting a current to the load, until the short circuit of the voltage feedback unit is terminated.

Compared with the prior art, this technical solution has the following advantages.

The present invention provides a power supply protection circuit, comprising a current control unit, a voltage feedback unit, and a current pull-up unit. The voltage feedback unit is connected to the current control unit, the voltage feedback unit obtains the feedback voltage of the output voltage and feeds back the feedback voltage to the current control unit, and the current control unit uses the feedback voltage to control the current control unit to regulate an output current. The current pull-up unit is connected to the feedback terminal of the voltage feedback unit, and the current pull-up unit provides the voltage feedback unit with the pull-up current. If the voltage of the feedback terminal of the voltage feedback unit continuously increases in the charging process, the feedback terminal of the voltage feedback unit is not short-circuited; if the voltage of the feedback terminal is always lower than the standard threshold even if the feedback terminal is charged, the feedback terminal of the voltage feedback unit is short-circuited. Different protection actions are performed according to the type of the short circuit, which effectively increase the reliability of the circuit.

The present invention further provides a current protection method. When the circuit is started, the current pull-up unit will charge the voltage feedback unit, and if the voltage of the feedback terminal of the voltage feedback unit cannot be pulled up and is always lower than or equal to the standard threshold, the feedback terminal of the voltage feedback unit is determined to be short-circuited. The short circuit of the feedback terminal of the voltage feedback unit is pre-determined, and then the corresponding protection action is performed, thereby solving the problem that when the feedback terminal of the voltage feedback unit is short-circuited, an output power is far bigger than the output power during the normal operation, and the output voltage is higher than a control voltage, causing the power supply circuit or the load to be damaged. Thus, the system reliability is improved.

DETAILED DESCRIPTION OF THE INVENTION

Figure 1:
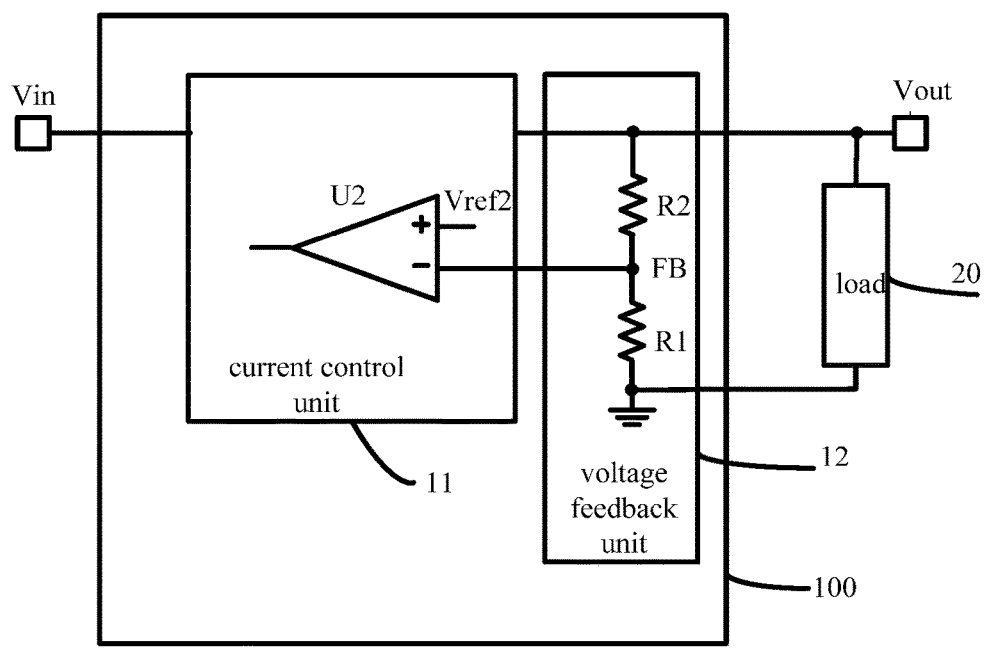
FIG. 1 is a structural schematic diagram of a conventional constant voltage output power supply circuit.

As shown in FIG. 1, in the prior art, a load 20 is short-circuited, and a constant voltage output power supply circuit 100 outputs its maximum output current; however, the maximum output current of the constant voltage output power supply circuit 100 will not be too big, an output voltage is close to 0 when the load is short-circuited, and the constant voltage output power supply circuit will not be damaged due to over-power.

However, when a feedback terminal (terminal FB) of a voltage feedback unit is short-circuited to the ground, i.e., when a first resistor R1 is short-circuited, a output control circuit still considers the output to be short-circuited, and an output current will also reach the maximum output current of the constant voltage output power supply circuit. Since the load is not short-circuited, the output power at this time is far greater than the output power during the normal operation, the output voltage increases, and the output voltage cannot be stabilized at the preset voltage, such that the constant voltage output power supply circuit or the load is damaged.

Figure 2:
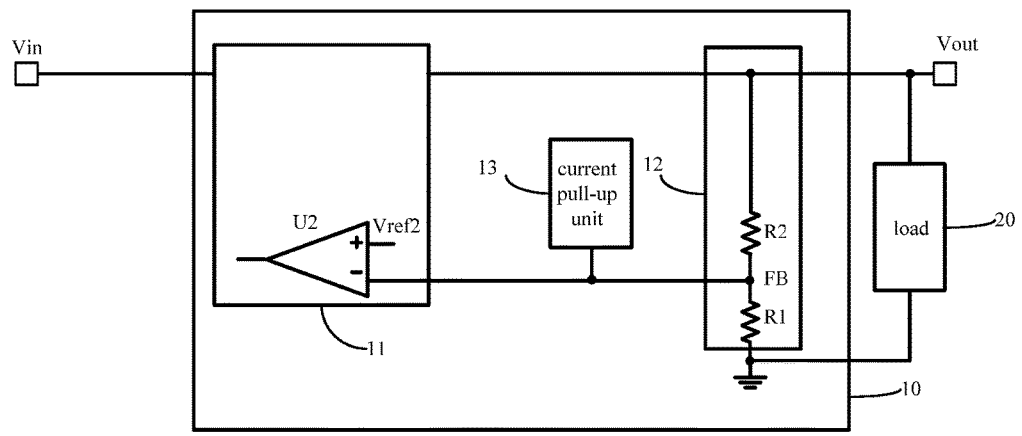
FIG. 2 is a structural schematic diagram of a power supply protection circuit of a first embodiment of the present application.

Based on this, the present invention provides a power supply protection circuit and a method, which will be described in detail by combining the specific embodiments and the accompanying drawings:

As shown in FIG. 2, in one embodiment, the power supply protection circuit includes a current control unit 11, a voltage feedback unit 12, and a current pull-up current 13.

The voltage feedback unit 12 consists of a first resistor R1 and a second resistor R2 connected in series, and their common point is the feedback terminal FB of the output voltage.

The current control unit 11 includes a second operational amplifier U2, its first input terminal is connected to a second reference signal $V_{ref2}$, and its second input terminal is connected to the output voltage feedback terminal. The constant voltage output of the entire power supply protection circuit 10 is controlled according to the comparison result between a feedback voltage $V_{FB}$ of the feedback terminal and the second reference signal.

The current pull-up unit 13 is also connected to the output voltage feedback terminal and can charge the first resistor R1 in the voltage feedback unit 12. After voltage feedback unit 12 is charged, the feedback voltage $V_{FB}$ changes. If the feedback voltage $V_{FB}$ is always close to a standard threshold, the first resistor R1 is short-circuited, wherein the standard threshold is a preset low voltage value, e.g., 0.1V. Specifically, the standard threshold is a voltage value a little higher than the voltage value reached by the feedback terminal FB when the first resistor R1 is short-circuited and after the current pull-up unit 13 provides the first resistor R1 with the pull-up current.

The detailed work principles are as follows.

At some time, the current pull-up unit 13 charges the first resistor R1 of the voltage feedback unit 12 (i.e., the current pull-up unit 13 provides the first resistor R1 with the pull-up current). If the first resistor R1 is short-circuited and abnormal, the voltage of the feedback terminal FB is still very low, lower than the standard threshold. However, if the feedback terminal FB is not short-circuited or abnormal, due to the charging of the current pull-up unit 13, the voltage of the feedback terminal FB will be pulled up to a set value. Thus, it can be determined whether the feedback terminal of the voltage feedback unit is short-circuited. If the feedback terminal is short-circuited, the power supply protection circuit 10 will perform the corresponding protection action. Specifically, the current output to the load 20 can be stopped by controlling a main switch transistor of the current control unit 11.

In order to prevent the damage caused by the short circuit of the feedback terminal of the voltage feedback unit during the start, when the power supply protection circuit is started, the current pull-up unit 13 is controlled to operate, i.e., charge the first resistor R1. If the feedback terminal FB is short-circuited, the voltage of the feedback terminal FB is close to 0 and is always lower than the standard threshold; if the feedback terminal FB is not short-circuited, the voltage of the feedback terminal FB can be pulled up to the set value. It can determine whether the feedback terminal of the voltage feedback unit 12 is short-circuited by detecting the voltage $V_{FB}$ of the feedback terminal FB.

However, if the current pull-up unit 13 continues to charge the first resistor R1 after the system is started, it will affect the sampling on the output voltage by the voltage feedback unit, and the power supply protection circuit 10 losses the constant voltage function, causing the output voltage unstable.

Figure 3:
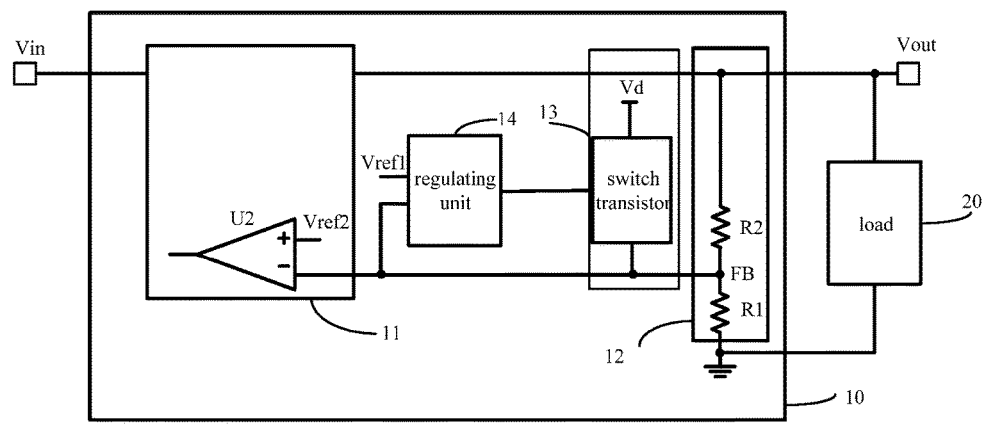
FIG. 3 is a structural schematic diagram of a power supply protection circuit of a second embodiment of the present application.

In order to solve the problem that the power supply protection circuit can also determine the short circuit condition of the voltage feedback unit 12 after the system is started, in another embodiment, the circuit further includes a regulating unit 14. Please refer to FIG. 3.

The regulating unit 14 has two input terminals and one output terminal, the first input terminal is connected to a first reference signal $V_{ref1}$, and the second input terminal is connected to the feedback terminal of the voltage feedback unit 12. The output terminal is connected to a control terminal of the switch transistor. An output signal of the regulating unit 14 is a control signal of the current pull-up unit 13. The current pull-up unit 13 receives the control signal to regulate its own output current.

Specifically, the current pull-up unit 13 consists of a power supply Vd and the switch transistor connected in series, and the switch transistor may be a transistor or a triode. The gate electrode of the transistor or the base electrode of the triode is the input terminal of the current pull-up unit, and the output terminal of the regulating unit 14 is connected to the gate electrode or base electrode.

The detailed working principles are as follows.

During the normal operation, $V_{FB}=V_{ref2}$, the output voltage of the power supply protection circuit $V_{out}=V_{ref2}*(R1+R2)/R1$, and the control signal output by the regulating unit 14 is not sufficient to drive the current pull-up unit 13 to operate. Thus, the current of the current pull-up unit 13 is 0, and the current pull-up unit does not charge the voltage feedback unit, which does not affect the normal feedback loop operation of the power supply protection circuit.

When the load is short-circuited, $V_{FB}<V_{ref1}$, the control signal output by the regulating unit 14 drives the current pull-up unit 13, and the current pull-up unit 13 charges the first resistor R1. With the progress of charging, the voltage at the two ends of the first resistor R1, i.e., the voltage $V_{FB}$ of the feedback terminal FB, becomes higher and higher and finally is regulated to be equal to $V_{ref1}$. At that time, the output current I1 of the current pull-up unit 13 is a set value, wherein $I1=V_{ref1}/(R1//R2)$.

When the feedback terminal of the voltage feedback unit 12 is short-circuited, i.e., when the first resistor R1 is short-circuited, the voltage at the feedback terminal FB is 0, and the control signal output by the regulating unit 14 reaches the maximum driving voltage to drive the current pull-up unit 13, such that the output current of the current pull-up unit 13 reaches the maximum. However, even if the output current of the current pull-up unit 13 reaches the maximum, the voltage of the feedback terminal FB is still close to 0, lower than the standard threshold, and cannot reach $V_{ref1}$.

Therefore, an operator can distinguish between the short circuit of the load and the short circuit of the feedback terminal of the voltage feedback unit by determining the output current of the current pull-up unit; the operator can also distinguish between the short circuit of the load and the short circuit of the feedback terminal of the voltage feedback unit by the control signal of the current pull-up circuit; or the operator can also make a determination by detecting the voltage of the feedback terminal.

When the load is short-circuited, the current of the current pull-up unit is a set value, its control signal is also regulated to be a set value, and the voltage $V_{FB}$ of the feedback terminal is also a set value.

However, when the feedback terminal of the voltage feedback unit is short-circuited, the output current and the control signal of the current pull-up circuit are regulated to be a limit value, and the voltage $V_{FB}$ of the feedback terminal is always close to 0, lower than the standard threshold.

Thus, the operator can distinguish between two conditions where the load 20 is short-circuited and the feedback terminal of the voltage feedback unit 12 is short-circuited during the operation, and the power supply protection circuit performs different protection actions according to different conditions of the short circuits. The detail is described hereinbelow.

When the load is short-circuited, the maximum current is output; or output the maximum current for a period of time, stop work for a period of time, and then output the maximum current for a period of time . . . (repeat these steps).

When the first resistor R1 is short-circuited, the circuit stops outputting the current to the load. However, the voltage feedback unit and the current control unit still operate normally, which can be specifically realized by controlling the work state of the main switch transistor of the current control unit.

When the short circuit of the first resistor R1 is terminated, since there is a current flowing from the switch transistor to the first resistor R1, the voltage of the feedback terminal FB will increase, and the current flowing through the switch transistor is reduced. Thus, it is determined when the short circuit of the first resistor R1 is terminated by detecting the voltage $V_{FB}$ or the output current of the current pull-up unit, and then outputting current to the load is resumed; thus, when the first resistor R1 is short-circuited, the output voltage $V_{out}$ will not increase above the control voltage, which causes the power supply circuit or the load to be damaged.

Figure 4:
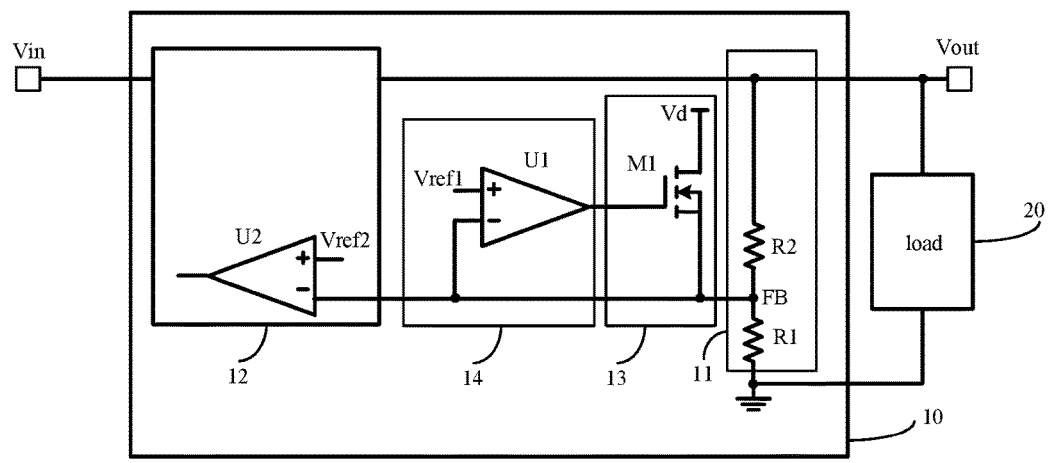
FIG. 4 is a structural schematic diagram of a power supply protection circuit of a third embodiment of the present application.

In the third embodiment as shown in FIG. 4, the regulating unit 14 includes a first operational amplifier U1, and the switch transistor is a negative channel metal oxide semiconductor (NMOS) transistor M1. The source electrode of the NMOS transistor M1 is connected to the feedback terminal FB, the gate electrode is connected to the output terminal of the first operational amplifier U1, and the drain electrode is connected to the power supply Vd. The detailed work principles are as follows.

During the normal operation, $V_{FB}=V_{ref2}$, the output voltage $V_{out}=V_{ref2}*(R1+R2)/R1$ is output. A positive input terminal of the first operational amplifier U1 is the first input terminal, connected to the first reference voltage $V_{ref1}$, wherein $0<V_{ref1}<V_{ref2}$. Therefore, a negative input terminal voltage $V_{FB}$ of the first operational amplifier U1 is greater than the positive input terminal voltage $V_{ref1}$, the first operational amplifier U1 outputs a low level, which is smaller than the lowest driving voltage of the current pull-up unit, and the NMOS transistor M1 is turned off.

When the load is short-circuited, $V_{FB}<V_{ref1}$, and the first operational amplifier U1 outputs a high level, greater than the minimum driving voltage of the current pull-up unit. The NMOS transistor M1 is turned on, the current pull-up unit outputs the current, and the voltage of the feedback terminal FB is regulated to be $V_{ref1}$. The current flowing through the NMOS transistor M1 is $I1=V_{ref1}/(R1//R2)$.

When the first resistor R1 is short-circuited, the voltage of the feedback terminal FB is 0, the voltage output by the first operational amplifier U1 is the maximum, and the control voltage of the current pull-up unit reaches the maximum driving voltage. The current I2 flowing through the NMOS transistor M1 will be very large, at least greater than the current I1.

Therefore, the operator can distinguish between the conditions where the short circuit of the load and the short circuit of the first resistor R1 by determining the current flowing through the NMOS transistor M1, or the operator can distinguish between the conditions where the short circuit of the load and the short circuit of the first resistor R1 by the voltage of the gate electrode of the NMOS transistor M1. When the voltage of the gate electrode of the NMOS transistor M1 is regulated to be a set value, the load is short-circuited; while when the voltage of the gate electrode of the NMOS transistor M1 is the highest voltage, the first resistor R1 is short-circuited.

Figure 5:
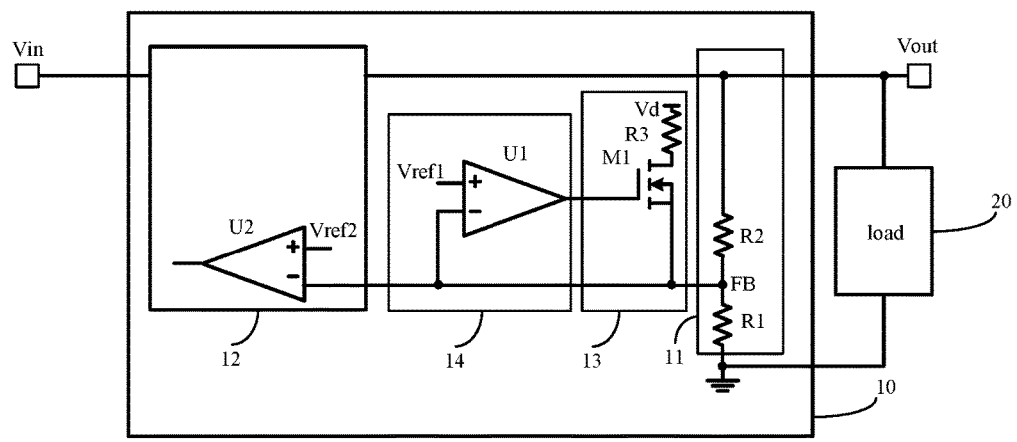
FIG. 5 is a structural schematic diagram of a power supply protection circuit of a fourth embodiment of the present application.
Figure 6:
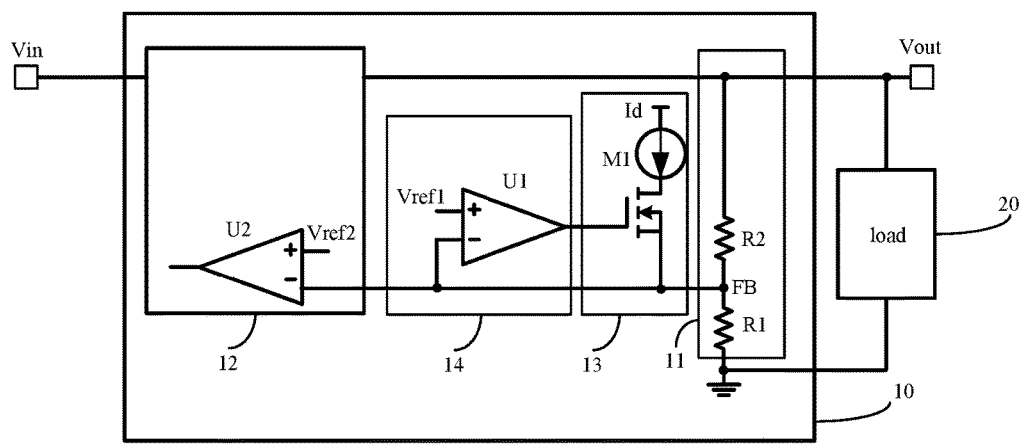
FIG. 6 is a structural schematic diagram of a power supply protection circuit of a fifth embodiment of the present application.

When the first resistor R1 is short-circuited, if the current flowing through the NMOS transistor M1 is not limited, the current will be very large, and even the power supply Vd will be pulled down. Thus, a current limiting function is added into the current pull-up unit 13, and a third resistor R3 is connected in series on the branch on which the power supply Vd and the NMOS transistor M1 are connected series, as shown in FIG. 5. In other embodiments, in order to limit the current flowing through the NMOS transistor M1 not to be too large, the power supply may be set as a current source Id, specifically as shown in FIG. 6.

Figure 7:
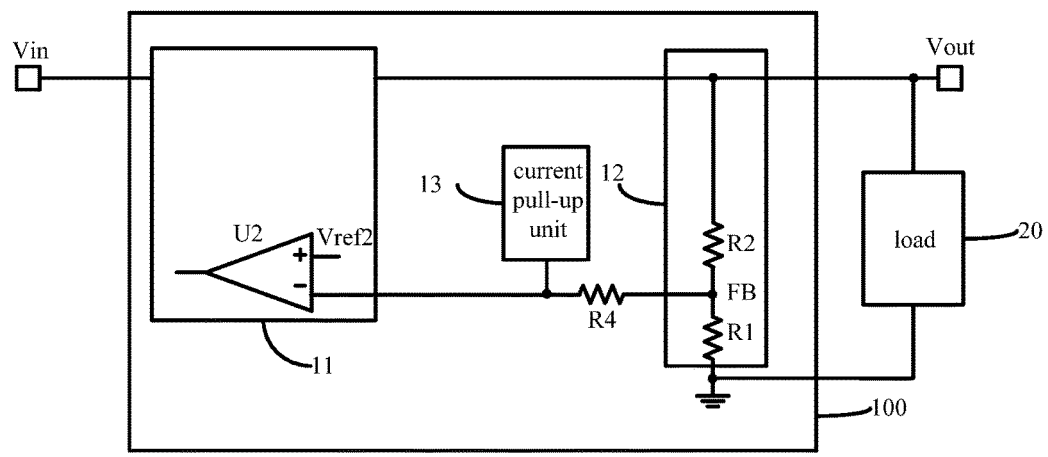
FIG. 7 is a structural schematic diagram of a power supply protection circuit of a six embodiment of the present application.

In another embodiment of the present application, when the second reference signal $V_{ref2}$ is close to the output voltage, the upper voltage-dividing resistor R2 of the voltage feedback unit is far smaller than the lower voltage-dividing resistor R1. When the load is short-circuited and the feedback terminal FB is short-circuited, the current of the pull-up current unit will reach the maximum current, and thus the short circuit of the load may be determined as the short circuit of the feedback terminal FB, so as to stop outputting the current to the load. In order to avoid the above phenomenon, a fourth resistor R4 is connected between the feedback terminal FB of the voltage feedback unit and the current pull-up unit, as shown in FIG. 7. Thus, when the load is short-circuited, it will not be determined as the short circuit of the feedback terminal of the voltage feedback unit.

According to the above power supply protection circuit, the present invention further provides a current protection method, which specifically is:

when the circuit is started, the current pull-up unit operates to provide the voltage feedback unit with the current; and detecting the voltage $V_{FB}$ of the feedback terminal of the voltage feedback unit; if the voltage $V_{FB}$ is lower than a standard threshold, the voltage feedback unit is determined to be short-circuited, and the current control unit stops outputting the current to the load; otherwise, the circuit is started normally.

The present invention further provides a method for determining the type of the short circuit during the start and after the normal operation, which specifically is:

comparing the feedback voltage $V_{FB}$ with the first reference signal;

if the feedback voltage $V_{FB}$ is smaller than the first reference signal $V_{ref1}$, the regulating unit outputs a low voltage, and the current pull-up unit does not provide the pull-up current;

if the feedback voltage is smaller than the first reference signal, the regulating unit outputs a voltage higher than the lowest driving voltage of the current pull-up unit, and the current pull-up unit provides the voltage feedback unit with the pull-up current according to the output voltage of the regulating unit;

determining the type of the short circuit according to the value of the output voltage of the regulating unit or the pull-up current; and if the output voltage of the regulating unit reaches the maximum driving voltage or the pull-up current reaches the maximum pull-up current, the feedback terminal of the voltage feedback unit is short-circuited; otherwise, the load is short-circuited.

Different protection actions are performed according to the type of the short circuit.

The specific protection action is: when the feedback terminal of the voltage feedback unit is short-circuited, the protection action is stopping outputting the current to the load, until the short circuit of the feedback terminal of the voltage feedback unit is terminated.

Alternatively, when the load is short-circuited, the protection action is that the main circuit intermittently outputs the current to the load or intermittently stops outputting the current to the load. After the load is determined to be short-circuited, all the circuits participating in the short circuit protection of the feedback terminal of the voltage feedback unit do not affect the operation of other circuits, e.g., the regulating circuit and the current pull-up circuit. The specific implementation of all the protection actions may be realized by controlling the main switch transistor of the current control unit.

Although the present application has been disclosed above by preferred embodiments, they are not used to define the present invention. Any of those skilled in the art may make possible changes and modifications to the technical solutions of the present invention by using the above disclosed methods and technical contents without departing from the spirits and scopes of the present invention. Therefore, any simple amendments, equivalent changes and modifications made to the above embodiments which do not depart from the technical solutions of the present invention and are in accordance with the technical essences of the present invention belong to the protection of the technical solutions of the present invention.

What is claimed is:

1. A power supply protection method for applying a power supply protection circuit,
   wherein the power supply protection circuit comprises a current control unit, a voltage feedback unit, and a current pull-up unit; the voltage feedback unit is connected to the current control unit, the voltage feedback unit obtains a feedback voltage of an output voltage and feeds back the feedback voltage to the current control unit, and the current control unit uses the feedback voltage to control the current control unit to regulate an output current; and
   the current pull-up unit is connected to a feedback terminal of the voltage feedback unit, and the current pull-up unit provides the voltage feedback unit with a pull-up current to determine whether the feedback terminal of the voltage feedback unit is short-circuited,
   the power supply protection circuit further comprising a regulating unit, an input terminal of the regulating unit being connected to the feedback terminal of the voltage feedback unit, and the regulating unit regulating the pull-up current of the current pull-up unit according to the feedback voltage, so as to determine whether the feedback terminal of the voltage feedback unit is short-circuited,
   the regulating unit comprises a first operational amplifier, a first input terminal of the first operational amplifier receives a first reference signal, a second input terminal is connected to the feedback voltage, and an output terminal of the first operational amplifier is connected to the current pull-up unit, and
   a first input terminal of the current control unit is connected to a second reference signal, and a voltage of the first reference signal is smaller than a voltage of the second reference signal,
   wherein the power supply protection method comprises the following steps:
   comparing the feedback voltage with the first reference signal;
   if the feedback voltage is greater than the first reference signal, the regulating unit outputting a voltage lower than a lowest driving voltage of the current pull-up unit, and the current pull-up unit being disabled to provide the pull-up current;
   if the feedback voltage is smaller than the first reference signal, the regulating unit outputting a voltage higher than the lowest driving voltage of the current pull-up unit, and the current pull-up unit providing the voltage feedback unit with the pull-up current according to the output voltage of the regulating unit;
   determining a type of a short circuit according to a value of the output voltage of the regulating unit or the pull-up current; and
   if the output voltage of the regulating unit reaches a maximum driving voltage or the pull-up current reaches a maximum pull-up current, the feedback terminal of the voltage feedback unit being short-circuited; otherwise, a load being short-circuited.

2. The power supply protection method of claim 1, wherein when the feedback terminal of the voltage feedback unit is short-circuited, perform a protection action of stopping outputting a current to the load, until the short circuit of the voltage feedback unit is terminated.

* * * * *